(12) United States Patent
Harvey et al.

(10) Patent No.: US 7,492,608 B2
(45) Date of Patent: Feb. 17, 2009

(54) ELECTROMAGNETIC INTERFERENCE SHIELD FOR DATA STORAGE SYSTEMS

(75) Inventors: Robert Harvey, Wichita, KS (US); Marc Mayfield, Douglas, KS (US); Justin Mortensen, Wichita, KS (US)

(73) Assignee: LSI Corporation, Milpitas, CA (US)

( * ) Notice: Subject to any disclaimer, the term of this patent is extended or adjusted under 35 U.S.C. 154(b) by 276 days.

(21) Appl. No.: 11/130,618

(22) Filed: May 17, 2005

(65) Prior Publication Data
US 2006/0262513 A1 Nov. 23, 2006

(51) Int. Cl.
*H05K 9/00* (2006.01)
(52) U.S. Cl. .............................. 361/816; 361/818
(58) Field of Classification Search ............... 361/752, 361/790, 797, 800, 801–802, 683–686, 816, 361/818; 174/35 R, 51
See application file for complete search history.

(56) References Cited

U.S. PATENT DOCUMENTS

| | | | | |
|---|---|---|---|---|
| 5,549,375 A | * | 8/1996 | Pagliaccio | 312/319.1 |
| 5,600,091 A | * | 2/1997 | Rose | 174/372 |
| 6,621,000 B2 | * | 9/2003 | Jensen et al. | 174/359 |
| 6,775,131 B2 | * | 8/2004 | Hanson | 361/685 |
| 6,852,924 B2 | * | 2/2005 | Lessard | 174/50 |
| 7,054,155 B1 | * | 5/2006 | Mease et al. | 361/695 |
| 2002/0157844 A1 | * | 10/2002 | Laflamme et al. | 174/50 |
| 2003/0221849 A1 | * | 12/2003 | Pommerenke et al. | 174/35 GC |
| 2004/0183260 A1 | * | 9/2004 | Kestly | 277/593 |
| 2006/0007644 A1 | * | 1/2006 | Huilgol et al. | 361/681 |

* cited by examiner

*Primary Examiner*—Hung S Bui
(74) *Attorney, Agent, or Firm*—Suiter Swantz PC LLO

(57) ABSTRACT

A system including an EMI shield. In an embodiment, the system includes a chassis with at least one bay for receiving a replaceable unit and a lip. The replaceable unit includes a housing and a faceplate. Further, a gasket is operationally coupled to the replaceable unit housing and the replaceable unit faceplate for reducing electromagnetic radiation emissions from the replaceable unit and chassis interface. The gasket may include four sides which are configured to provide a varying force-compression curve along the length of the gasket. Upon installation of the replaceable unit, the lip defined within the chassis compresses the gasket to provide a constant force per unit length and form an electromagnetic interference shield with uninterrupted electrical conductivity.

13 Claims, 3 Drawing Sheets

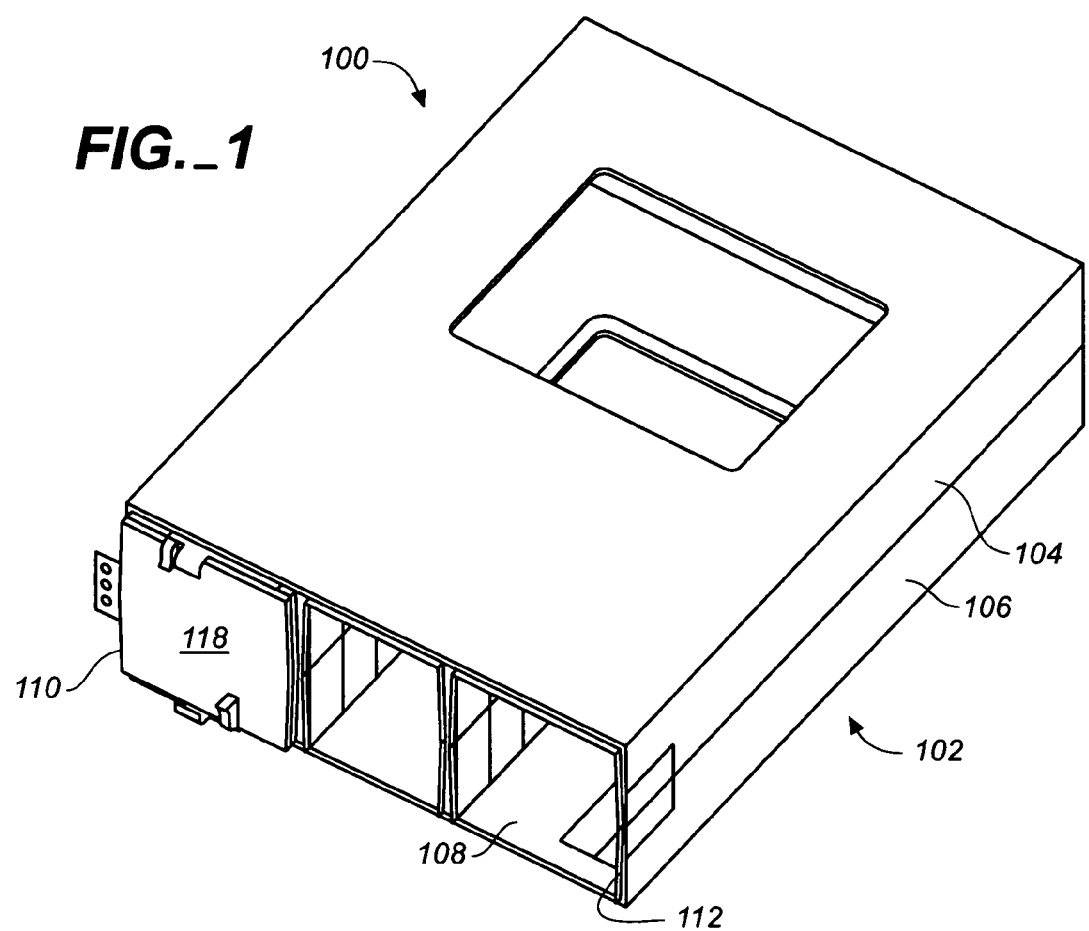
FIG._1
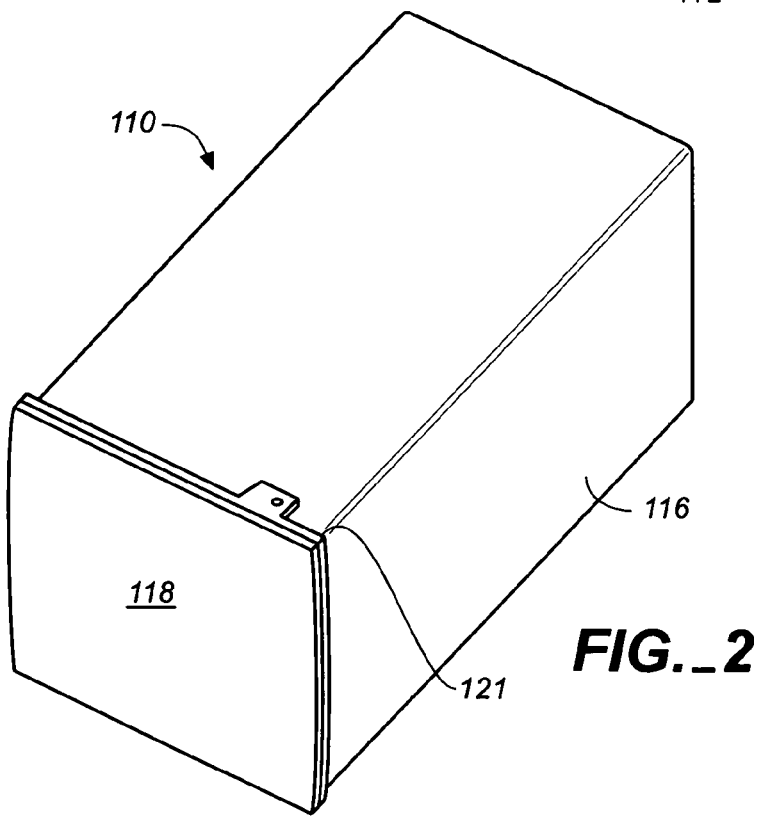
FIG._2

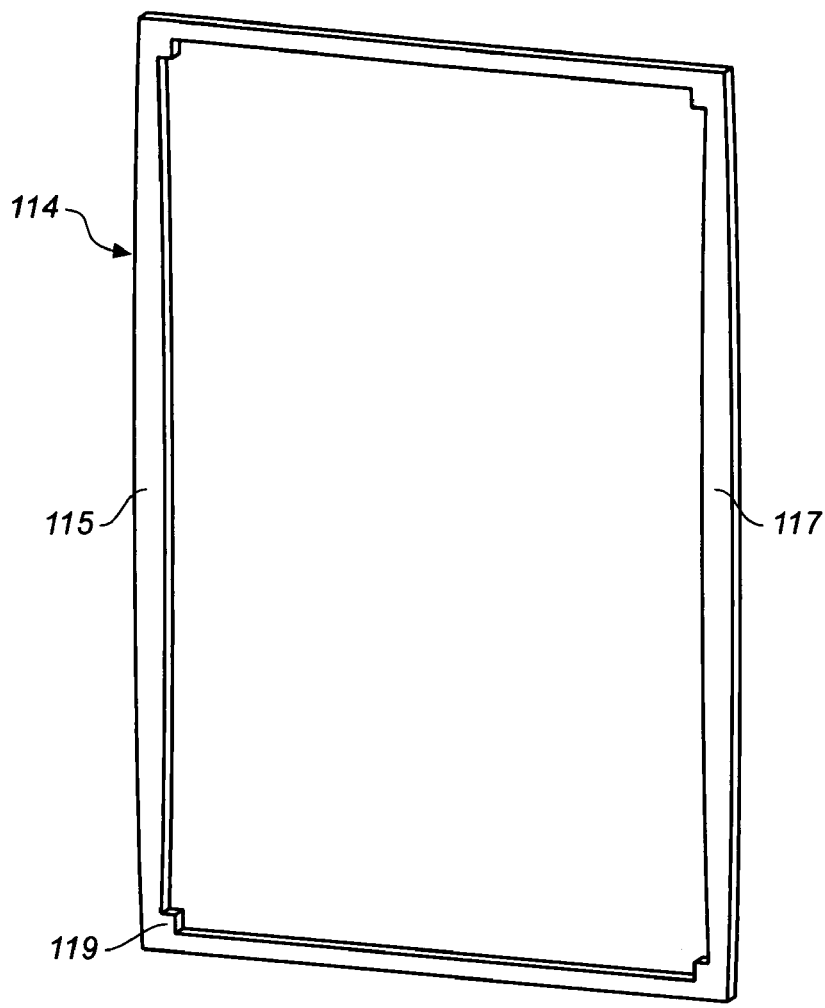
FIG._3
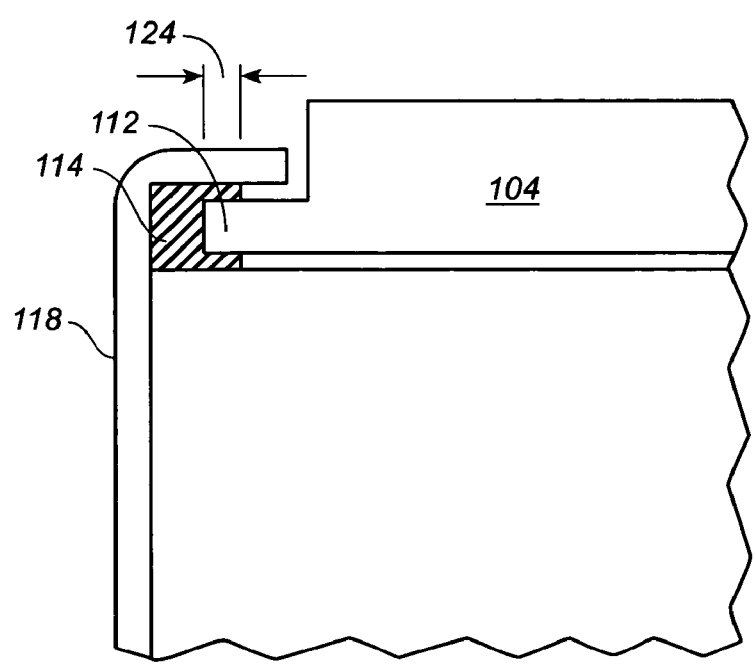
FIG._5

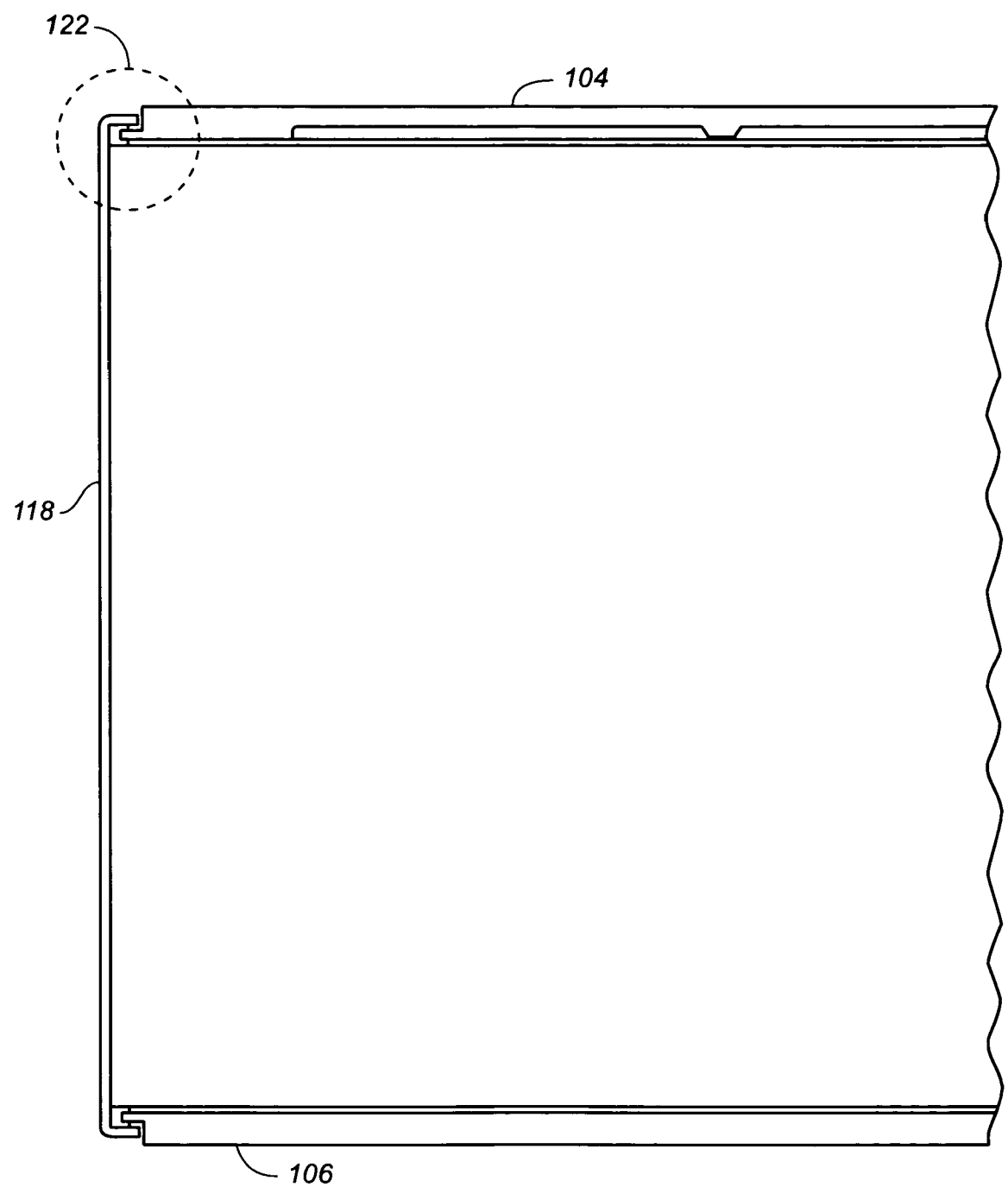
FIG._4

ELECTROMAGNETIC INTERFERENCE SHIELD FOR DATA STORAGE SYSTEMS

FIELD OF THE INVENTION

The present invention relates to the field of computer systems and configurations and more particularly to an electromagnetic interference (EMI) shield for a customer replaceable unit (CRU) within a computer chassis.

BACKGROUND OF THE INVENTION

Electronic equipment including computer systems frequently emit undesirable electronic magnetic radiation, commonly referred to as electromagnetic interference (EMI). The ever increasing complexity of modern computer systems and information networks has made the ability to comply with EMI emission requirements more difficult. For example, increased higher operating frequencies have resulted in increased EMI emissions from computer systems. Additionally, the higher frequency chips emit EMI at higher frequencies. The higher frequency EMI may emanate from an enclosure through smaller openings when compared to lower frequency EMI which was present in earlier computer systems. As a result, the emission of EMI through slots, apertures, and seams present in conventional EMI shielding is becoming increasingly problematic.

Regulations set forth by the Federal Communications Commission (FCC) do not permit products to emit EMI above pre-defined thresholds. Thus, containment of EMI is required for a variety of computer components including data storage systems in order for such systems to be certified by the FCC. Typically, data storage enclosures have joints or seams where two or more parts are joined together. These joints are a major source of EMI emission for the data storage system.

Several methods currently exist for EMI containment in data storage systems. One conventionally utilized method for EMI containment is the use of "spring" type clips made of beryllium copper or stainless steel affixed to the periphery of the CRU. An additional method is the use of metallic tape affixed to the seam or joint area. Moreover, metallic foam gasket material has been installed in and along seams and joints in a "single strip" orientation to shield EMI.

Common disadvantages associated with the currently available methods entail increased part counts, increased costs, and increased assembly labor rates. In addition, current EMI shielding designs are inferior for they do not incorporate a continuous seal for the entire joint. Installation of metallic foam gasket material in and along seams and joints in a "single strip" orientation may allow electromagnetic radiation to emanate from the points where the seams and joint meet. Further, certain gasket types (e.g. wire mesh gaskets) may exhibit severe compression set which may prevent the gasket from providing a repeatable sealing function. Lastly, current EMI containment approaches are often iterative. Thus, the end cumulative solution often has additive parts and may drive the finished product to appear aesthetically unpleasing.

Therefore, it would be desirable to a provide an uninterrupted, continuous EMI shield for a data storage system thereby allowing for uninterrupted conductivity and EMI shielding in accordance with desired standards.

SUMMARY OF THE INVENTION

Accordingly, the present invention is directed to a system including an EMI shield. In an aspect of the present invention, the system includes a chassis with at least one bay or slot for receiving a replaceable unit. Further, a lip is defined within the chassis. In such an aspect, the replaceable unit includes a housing and a faceplate. Moreover, a gasket is operationally coupled to the replaceable unit housing and the replaceable unit faceplate for reducing electromagnetic radiation emissions from the replaceable unit and chassis interface. The gasket may include four sides which are configured to provide a varying force-compression curve along the length of the gasket. Upon installation of the replaceable unit, the lip defined within the chassis compresses the gasket to provide a constant force per unit length and forms an electromagnetic interference shield with uninterrupted electrical conductivity.

In a further aspect of the present invention, the gasket may be formed of conductive foam material and continuous. Moreover, the gasket may be configured to provide a varying force-compression curve along the length of the gasket by varying the thickness of the sides of the gasket. Additionally, the gasket may be die cut to geometrically match the replaceable unit faceplate, replaceable unit housing and chassis lip.

In an additional aspect of the present invention, a data storage system including a continuous EMI shield is provided. In such aspect, the data storage system includes a chassis with at least one bay or slot for receiving a CRU. Further, the chassis includes a lip. The CRU may include a CRU housing and a CRU faceplate. Additionally, a gasket is operationally coupled to the CRU housing and the CRU faceplate for reducing electromagnetic radiation emissions from the CRU and chassis interface. The gasket includes four sides which are continuous, being formed of conductive foam material and configured to provide a varying force-compression curve along the length of the gasket. Upon installation of the CRU, the lip defined within the chassis compresses the gasket to provide a constant force per unit length and forms a continuous electromagnetic interference shield with uninterrupted electrical conductivity.

In accordance with specific aspects of the present data storage system including a continuous EMI shield, the lip defined within the computer chassis may be formed around the periphery of at least one bay or slot for receiving a CRU. For example, such lip may include four sides. Further, in an embodiment, the four sides of the gasket dimensionally correspond to the four sides defining the lip formed around the periphery of the at least one bay or slot for receiving a CRU including the CRU housing and the CRU faceplate. Moreover, in an embodiment, the CRU faceplate is fastened to the CRU housing via fasteners. Additionally, the gasket may be configured to provide a varying force-compression curve along the length of the gasket by varying the thickness of the sides of the gasket. Furthermore, in a specific aspect, the gasket is die cut to geometrically match the CRU faceplate, CRU housing and chassis lip.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is an isometric view of a data storage system in accordance with the present invention, wherein the data storage system includes a chassis with CRU slots;

FIG. 2 is an isometric view of a CRU in accordance with the present invention, wherein the includes a CRU housing and a CRU faceplate;

FIG. 3 is an isometric view of an EMI shield in accordance with the present invention, wherein the shield is an uninterrupted, continuous gasket;

FIG. 4 is a side cross-sectional view of an installed CRU within a chassis in accordance with the present invention, wherein the position of an EMI shield in relation to a lip defined within the chassis is illustrated; and FIG. 5 is an expanded side cross-sectional view of the installed CRU illustrated in FIG. 4, wherein the EMI shield is compressed by the chassis lip.

DETAILED DESCRIPTION OF THE INVENTION

Reference will now be made in detail to the presently preferred embodiments of the invention, examples of which are illustrated in the accompanying drawings. It is to be appreciated that corresponding reference numbers refer to generally corresponding structures.

Referring in general to FIGS. 1-5, a continuous EMI gasket for a data storage system in accordance with the present invention is described. The instant EMI gasket is designed so that the gasket may be installed or placed behind a CRU faceplate thereby allowing the integration of the gasket to the faceplate of the CRU and thus, the CRU module. One of the advantageous features of the present invention is the use of a chassis lip for gasket compression. In an embodiment, the present invention utilizes a lip defined within the computer chassis for compressing the gasket upon installation of the CRU module into the computer chassis. Thus, the combination of the all in one continuous EMI shield with no breaks or interruptions and the use of the chassis as a compression member and control system for the shield provides the instant gasket with greatly enhanced electrical conductivity and overall effectiveness in reducing EMI emissions.

Referring now specifically to FIG. 1, a data storage controller system 100 in accordance with an exemplary embodiment of the present invention is provided. In the exemplary embodiment, the data storage system 100 includes a computer chassis 102. Such computer chassis 102 may include an upper housing 104 and a lower housing 106. In further embodiments, the computer chassis 102 includes a bay or slot 108 for receiving CRU modules. For example, as illustrated in FIG. 1, three CRU slots are present, two being empty and one with a CRU 110 installed. It is contemplated that the size as well as number of the CRU bay may vary depending upon user need and the specific chassis configuration. In additional embodiments, a lip 112 is defined within the computer chassis 102 for operationally coupling an EMI gasket or shield 114 (as shown in FIG. 3) the bay 108 for receiving the CRU 110. For example, as described in FIG. 1, the lip 112 may be formed around the periphery of each individual bay 108 designed to receive a CRU module.

As illustrated in FIG. 2, a typical CRU 110 includes a CRU housing 116 and a CRU faceplate 118. In an exemplary embodiment, the CRU housing 116 includes four sides and two ends. In the embodiment, the CRU faceplate 118 is coupled to the CRU housing 116 via fasteners. It is contemplated that various types of fasteners including screws may be utilized to couple the CRU faceplate 118 to the CRU housing 116. The CRU faceplate 118 protects the CRU module, increases the rigidity of the CRU module as well as provides a method of shielding EMI emissions from such module (as explained in detail below) when the CRU module is installed into a computer chassis.

Referring specifically to FIG. 3, an EMI gasket or shield 114 in accordance with the present invention is provided. As illustrated in FIG. 3, an exemplary EMI gasket or shield 114 includes 4 (four) sides which dimensionally correspond to four sides forming the lip 112 defined around the periphery of each bay 108 designed to receive a CRU module 110. For example, the EMI gasket 114 may be die cut to match the geometry of the CRU faceplate 118, CRU housing 116 and the chassis lip 112. If the CRU housing includes indented corners 121 (as illustrated in FIG. 2,), then the gasket 114 may include protrusions 119 to account for the additional space associated with the indented corners and prevent EMI emissions from such space.

In an embodiment, the gasket 114 is continuous with no breaks or interruptions within the gasket 114. Continuous may include a single piece of material with no breaks or interruptions rather than integration of multiple pieces of foam to create the desired shape. The uninterrupted, continuous gasket configuration is seamless thereby removing the problem of EMI emitting from seams or joints present within the given gasket/shield. In addition, this design reduces part counts and possibly subsequent product costs and labor associated with EMI solutions for the EMI shield for a given CRU module is contained within a single gasket rather than including multiple components as seen with conventional EMI shields. Further, in such embodiment, the gasket 114 is formed of conductive foam material including metallic foam. It is contemplated that additional materials including silicone elastomers filled with electrical conductive particles and the like may be employed to form the gasket.

With continued reference to FIG. 3, the instant gasket 114 is configured to provide a varying force-compression curve along the length of the gasket 114 so to optimally provide a constant force per unit length when the gasket is compressed by the CRU faceplate 118 and the chassis lip 112. For example, as illustrated in FIG. 3, the middle portion of gasket side 115 and gasket side 117 is thicker when compared to the end portions of the respective sides. Such configuration allows the gasket 114 to not only provide uninterrupted conductivity, but greatly enhanced conductivity when compared to a gasket with non-uniform compression. It is contemplated that additional configurations may be employed to impart a constant force per unit length when the gasket is compressed without departing from the scope and spirit of the present invention. For example, depending upon the geometry of a given CRU faceplate, CRU housing, and chassis lip, a gasket with a constant cross-section may be able to provide a constant force per unit length when the gasket is compressed by the CRU faceplate and the chassis lip.

As illustrated in FIGS. 4 and 5, in use, the gasket 114 is positioned behind the CRU faceplate 118. For example, the gasket 114 may be positioned between flanges which are defined within the CRU faceplate 118 and the CRU housing 116. When the CRU 110 is installed, the lip 112 within the chassis 102 compresses the gasket 114 as denoted as 122 in FIG. 4. Such configuration provides 360° (three hundred and sixty degrees) of continuous shielding of EMI emissions. For example, the lip 112 may compress the gasket 114 by 35 to 40% (thirty-five to forty percent) as represented by the area enclosed by the set of lines 124. Compression of the gasket 114 greatly enhances the electrical conductivity of the gasket by allowing the gasket sufficient deflection.

The installed position of the chassis lip 112, gasket 114, and CRU faceplate 118 as illustrated in FIGS. 4 and 5 is representative of a typical configuration for all CRU module's within the system. Further, it is contemplated that the use of the chassis 102 as a compression member and control system for the shield may be employed with alternative types of gaskets (e.g., gaskets which are not continuous, but included multiple pieces) and thus, such feature is not limited to the continuous gasket disclosed herein.

Although the present disclosure focuses upon the use of the gasket with a data storage system, it is contemplated that the disclosed gasket may be utilized with a variety of systems without departing from the scope and spirit of the present invention. Additionally, the use of a chassis lip as a compression member and control system for the shield/gasket may also be implemented in various environments.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A data storage system including an EMI shield, comprising:
   a chassis, the chassis including at least one bay for receiving a replaceable unit and a lip, the replaceable unit including a housing and a faceplate; and
   a gasket formed of conductive foam material operationally coupled to the replaceable unit housing and the replaceable unit faceplate for reducing electromagnetic radiation emissions from the replaceable unit and chassis interface, the gasket including four sides which are continuous and configured to provide a varying force-compression curve along the length of the gasket by varying a thickness of the four sides of the gasket;
   wherein upon installation of the replaceable unit the lip defined within the chassis compresses the gasket to provide a constant force per unit length and form a continuous electromagnetic interference shield with uninterrupted electrical conductivity, the gasket is continuous, and the gasket is die cut to geometrically match the replaceable unit faceplate, replaceable unit housing and chassis lip.

2. A system including a continuous EMI shield, comprising:
   a chassis, the chassis including at least one bay for receiving a replaceable unit and a lip, the replaceable unit including a housing and a faceplate; and
   a gasket operationally coupled to the replaceable unit housing and the replaceable unit faceplate for reducing electromagnetic radiation emissions from the replaceable unit and chassis interface, the gasket including four sides which are continuous and configured to provide a varying force-compression curve along the length of the gasket by varying a thickness of the four sides of the gasket; and
   wherein upon installation of the replaceable unit the lip defined within the chassis compresses the gasket to provide a constant force per unit length and form a continuous electromagnetic interference shield with uninterrupted electrical conductivity.

3. The system including a continuous EMI shield as claimed in claim 2, wherein the gasket is formed of conductive foam material.

4. The system including a continuous EMI shield as claimed in claim 2, wherein the lip is defined within the chassis by being formed around the periphery of at least one bay for receiving a replaceable unit.

5. The system including a continuous EMI shield as claimed in claim 4, wherein the lip formed around the periphery of the at least one bay for receiving a replaceable unit includes four sides.

6. The system including a continuous EMI shield as claimed in claim 2, wherein the replaceable unit faceplate is coupled to the replaceable unit housing via fasteners.

7. The system including a continuous EMI shield as claimed in claim 2, wherein the gasket is die cut to geometrically match the replaceable unit faceplate, replaceable unit housing and chassis lip.

8. A data storage system including a continuous EMI shield, comprising:
   a chassis, the chassis including at least one bay for receiving a customer replaceable unit and a lip, the customer replaceable unit including a customer replaceable unit housing and a customer replaceable unit faceplate; and
   a gasket operationally coupled to the customer replaceable unit housing and the customer replaceable unit faceplate for reducing electromagnetic radiation emissions from the customer replaceable unit and chassis interface, the gasket including four sides which are continuous, being formed of conductive foam material and configured to provide a varying force-compression curve along the length of the gasket by varying a thickness of the four sides of the gasket;
   wherein upon installation of the customer replaceable unit the lip defined within the chassis compresses the gasket to provide a constant force per unit length and form a continuous electromagnetic interference shield with uninterrupted electrical conductivity.

9. The data storage system including a continuous EMI shield as claimed in claim 8, wherein the lip is defined within the chassis by being formed around the periphery of at least one bay for receiving a customer replaceable unit.

10. The data storage system including a continuous EMI shield as claimed in claim 9, wherein the lip formed around the periphery of the at least one bay for receiving a customer replaceable unit includes four sides.

11. The data storage system including a continuous EMI shield as claimed in claim 10, wherein the four sides of the gasket dimensionally correspond to the four sides defining the lip formed around the periphery of the at least one bay for receiving a customer replaceable unit, the customer replaceable unit housing, and the customer replaceable unit faceplate.

12. The data storage system including a continuous EMI shield as claimed in claim 8, wherein the customer replaceable faceplate is coupled to the customer replaceable housing via fasteners.

13. The data storage system including a continuous EMI shield as claimed in claim 8, wherein the gasket is die cut to geometrically match the customer replaceable unit faceplate, customer replaceable housing and chassis lip.

* * * * *